(12) United States Patent
Taguchi

(10) Patent No.: US 8,847,255 B2
(45) Date of Patent: Sep. 30, 2014

(54) SEMICONDUCTOR LIGHT-EMITTING DEVICE

(75) Inventor: Hideyuki Taguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 225 days.

(21) Appl. No.: 12/668,554

(22) PCT Filed: Jul. 8, 2008

(86) PCT No.: PCT/JP2008/062313
§ 371 (c)(1),
(2), (4) Date: Jan. 11, 2010

(87) PCT Pub. No.: WO2009/008416
PCT Pub. Date: Jan. 15, 2009

(65) Prior Publication Data
US 2010/0207133 A1    Aug. 19, 2010

(30) Foreign Application Priority Data
Jul. 12, 2007   (JP) .................................. 2007-183218

(51) Int. Cl.
*H01L 33/00* (2010.01)
*H01L 25/075* (2006.01)
*H01L 33/62* (2010.01)
*H01L 33/48* (2010.01)

(52) U.S. Cl.
CPC ............. *H01L 25/0753* (2013.01); *H01L 33/62* (2013.01); *H01L 33/483* (2013.01); *H01L 2224/48227* (2013.01); *H01L 2224/45144* (2013.01)
USPC ................................ 257/98; 257/99; 257/100

(58) Field of Classification Search
USPC ...................... 257/E33.056, E33.066, 79–104
See application file for complete search history.

(56) References Cited

U.S. PATENT DOCUMENTS

2006/0171135 A1* 8/2006 Ishizaka et al. ................. 362/11

FOREIGN PATENT DOCUMENTS

| JP | 2000-244020 | 9/2000 |
|---|---|---|
| JP | 2003-17753 | 1/2003 |
| JP | 2003-204081 | 7/2003 |
| JP | 2006-24794 | 1/2006 |
| JP | 2006-210734 | 8/2006 |
| JP | 2006-222382 | 8/2006 |

* cited by examiner

*Primary Examiner* — Samuel Gebremariam
(74) *Attorney, Agent, or Firm* — Hamre, Schumann, Mueller & Larson, P.C.

(57) ABSTRACT

A semiconductor light emitting device (A) includes an elongated substrate (1) formed with a through-hole (11), a first, a second and a third semiconductor light emitting elements (3R, 3G, 3B) mounted on the main surface of the substrate (1), and an electrode (2R) electrically connected to the first semiconductor light emitting element (3R) and extending to the reverse surface of the substrate (1) via the through-hole (11). The first semiconductor light emitting element (3R) and the through-hole (11) are positioned between the second semiconductor light emitting element (3G) and the third semiconductor light emitting element (3B) in the longitudinal direction of the substrate (1). The second semiconductor light emitting element (3G) is arranged closer to one end of the substrate (1), whereas the third semiconductor light emitting element (3B) is arranged closer to the other end of the substrate (1).

16 Claims, 2 Drawing Sheets

US 8,847,255 B2

SEMICONDUCTOR LIGHT-EMITTING DEVICE

TECHNICAL FIELD

The present invention relates to a light emitting device including a plurality of semiconductor light emitting elements, in particular, to a side-view type light emitting device.

BACKGROUND ART

FIG. 4 illustrates an example of a conventional semiconductor light emitting device (see Patent Document 1 identified below, for example). The semiconductor light emitting device X illustrated in the figure includes a substrate 91 and three semiconductor light emitting elements 93R, 93G, 93B mounted on the main surface of the substrate 91. Specifically, the substrate 91 is provided with electrodes 92R, 92G, 92B on which the semiconductor light emitting elements 92R, 92G, 92B are bonded, respectively. The substrate 91 is further provided with a common electrode 92C, to which the semiconductor light emitting elements 93R, 93G, 93B are electrically connected via wires. The semiconductor light emitting elements 93R, 93G, 93B are surrounded by a case 95 made of a resin. The semiconductor light emitting device X is designed as a side-view type light emitting device to be mounted on e.g. a printed circuit board with a longitudinal side surface of the substrate 91 utilized as the mount surface.

Patent Document 1: JP-A-2006-24794

In recent years, there is a demand for size reduction of semiconductor light emitting devices. As to the side-view type semiconductor light emitting device described above, it is demanded to reduce the projecting amount (i.e., height) of the light emitting device from the printed circuit board on which the light emitting device is mounted. However, the reduction of the projecting amount means the reduction of the area of the main surface of the substrate 91, i.e., the reduction of the space required for placing the semiconductor light emitting elements 93R, 93G, 93B and the wires connected to the light emitting elements. Generally, as the space becomes narrower, it becomes more technically difficult to arrange necessary circuits in the space. Thus, with the conventional structure of the semiconductor light emitting device X, there is a limit on the size reduction.

DISCLOSURE OF THE INVENTION

The present invention has been proposed under the circumstances described above. It is therefore an object of the present invention to provide a semiconductor light emitting device suitable for size reduction.

A semiconductor light emitting device provided according to the present invention includes an elongated substrate, a first, a second and a third semiconductor light emitting elements, and an electrode. The substrate has a main surface in the form of an elongated rectangle, a reverse surface opposite to the main surface, a mount surface extending between the main surface and the reverse surface. The substrate has a first end and a second end spaced from each other in the longitudinal direction of the substrate. The substrate is formed with a through-hole extending from the main surface to the reverse surface. The first, the second and the third light emitting elements are mounted on the main surface of the substrate. The electrode is electrically connected to the first semiconductor light emitting element and extends to the reverse surface of the substrate via the through-hole. The first semiconductor light emitting element and the through-hole are positioned between the second semiconductor light emitting element and the third semiconductor light emitting element in the longitudinal direction of the substrate. The second semiconductor light emitting element is arranged closer to the first end of the substrate, whereas the third semiconductor light emitting element is arranged closer to the second end of the substrate.

Preferably, the semiconductor light emitting device further includes a wire, and a pad formed on the main surface of the substrate. The wire has a first end bonded to the first semiconductor light emitting element and a second end bonded to the pad. The pad is arranged at a position deviated from the second semiconductor light emitting element toward the first end of the substrate in the longitudinal direction of the substrate.

Preferably, the semiconductor light emitting device of the present invention further includes an additional wire for connecting the second semiconductor light emitting element and the pad to each other.

Preferably, the main surface of the substrate has a side edge extending in the longitudinal direction of the substrate, and the first semiconductor light emitting element is positioned closer to the side edge than the second and the third semiconductor light emitting elements are.

Preferably, the first semiconductor light emitting element is smaller in size than the second and the third semiconductor light emitting elements.

Preferably, the first semiconductor light emitting element is adapted to emit red light. One of the second and the third semiconductor light emitting elements is adapted to emit blue light, whereas the other one of the second and the third semiconductor light emitting elements is adapted to emit green light.

Other features and advantages of the present invention will become more apparent from the detailed description given below with reference to the accompanying drawings.

BEST MODE FOR CARRYING OUT THE INVENTION

A preferred embodiment of the present invention is described below with reference to the accompanying drawings.

Figure 1:
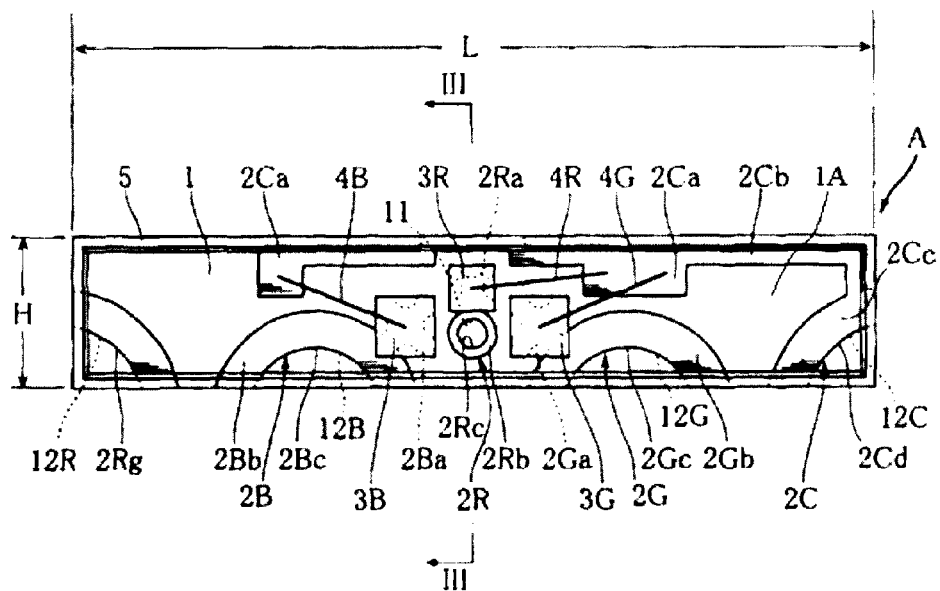
FIG. 1 is a front view illustrating an example of a semiconductor light emitting device according to the present invention.
Figure 2:
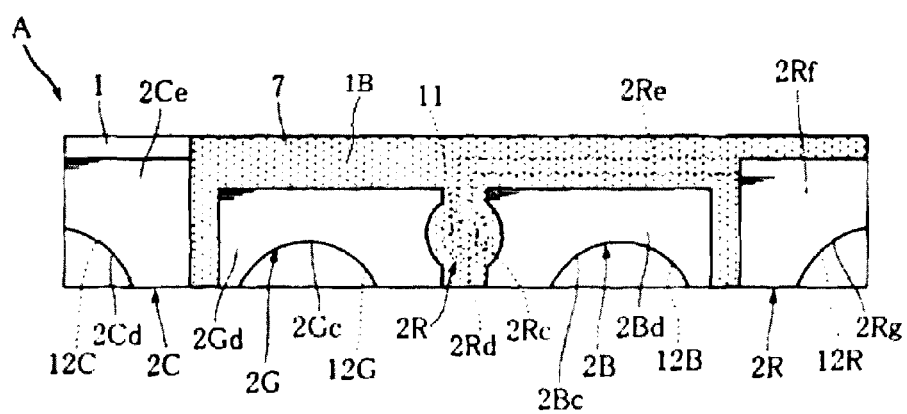
FIG. 2 is a rear view illustrating the semiconductor light emitting device of FIG. 1.
Figure 3:
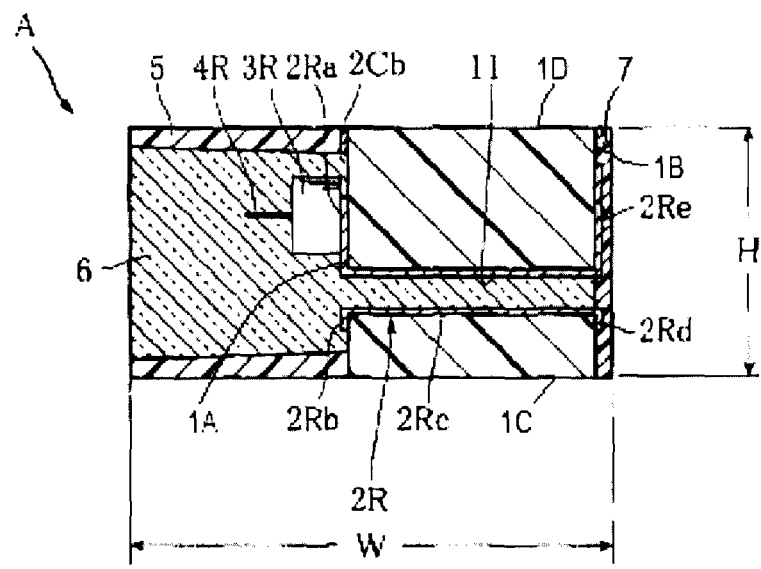
FIG. 3 is a sectional view taken along lines in FIG. 1.
Figure 4:
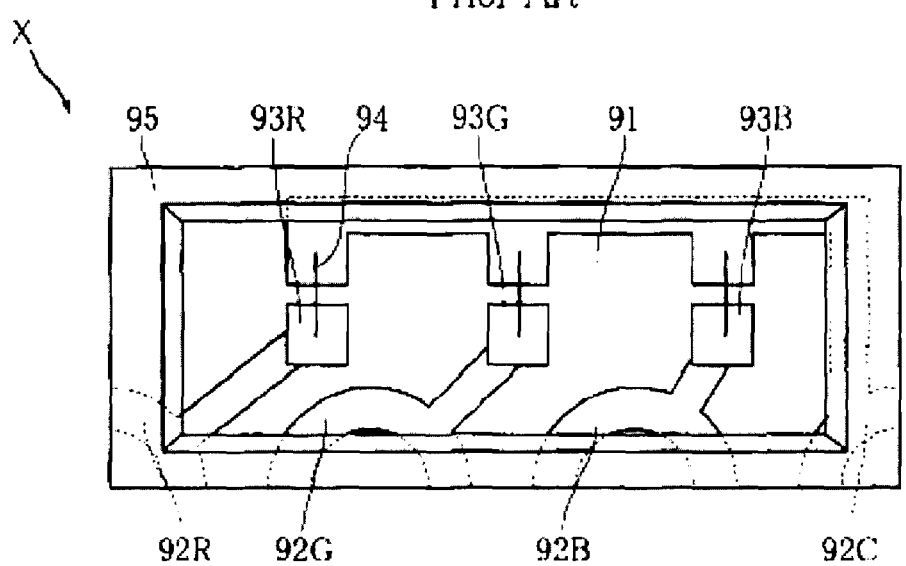
FIG. 4 is a plan view illustrating an example of a conventional semiconductor light emitting device.

FIGS. 1-3 illustrate an example of a semiconductor light emitting device according to the present invention. The illustrated light emitting device A includes an elongated insulating substrate 1, electrodes 2R, 2G, 2B, 2C, semiconductor light emitting elements 3R, 3G, 3B, wires 4R, 4G, 4B, a case 5 and a transparent protective resin 6 (FIG. 3). The light emitting device A is designed as a side-view type light emitting device to be mounted with a longitudinal side surface 1C of the substrate 1 (lower surface in FIGS. 1-3) utilized as the mount surface. The semiconductor light emitting elements 3R, 3G and 3B are adapted to emit red light, green light and blue light, respectively, which are combined to emit white light. The light emitting device A has a length L of about 2.7 mm, a height H of about 0.5 mm and a width W of about 0.95 mm. For easier understanding, the illustration of the protective resin 6 is omitted in FIG. 1.

The substrate 1 is made of e.g. a glass fiber-reinforced epoxy resin and in the form of an elongated rectangle. The substrate 1 includes a main surface 1A on which the three semiconductor light emitting devices 3R, 3G, 3B are mounted, and a reverse surface 1B opposite to the main surface 1A. The substrate 1 is formed with a through-hole 11 and a plurality of grooves 12R, 12G, 12B, 12C. As illustrated in FIG. 3, the through-hole 11 extends from the main surface 1A to the reverse surface 1B of the substrate 1 (i.e., in the thickness direction of the substrate 1). The grooves 12R, 12B, 12G, 12C are provided in the mount surface 1C of the substrate 1 (i.e., the lower surface in FIGS. 1-3) so as to be separated from each other and extend in the thickness direction of the substrate 1. The substrate 1 has a length of about 2.7 mm, a height of about 0.5 mm and a width of about 0.5 mm. The through-hole 11 has an inner diameter of about 0.15 mm.

The electrodes 2R, 2G, 2B, 2C are made of a plating layer of Cu, Ni or Au, for example, and formed on the main surface 1A, the side surface 1C (mount surface) and the reverse surface 1B of the substrate 1. The electrodes 2R, 2G, 2B, 2C are utilized for supplying power to the semiconductor light emitting elements 2R, 2G, 2B and mounting of the light emitting device A.

The electrode 2R is connected to the semiconductor light emitting element 3R and includes a bonding pad 2Ra, a first annular portion 2Rb, a cylindrical portion 2Rc, a second annular portion 2Rd, a strip portion 2Re, a reverse surface portion 2Rf and a mount portion 2Rg. The bonding pad 2Ra is provided on the main surface 1A of the substrate 1 at the center in the longitudinal direction, and the semiconductor light emitting element 2R is bonded to the bonding pad 2Ra. In the illustrated example, the bonding pad 2Ra is X-shaped. The first annular portion 2Rb adjoins the bonding pad 2Ra in the width direction of the substrate 1 (height direction) and surrounds the opening of the through-hole 11 on the main surface 1A of the substrate 1. The cylindrical portion 2Rc (see FIG. 3) is formed to cover the inner surface of the through-hole 11. The second annular portion 2Rd surrounds the opening of the through-hole 11 on the reverse surface 1B of the substrate 1. As illustrated in FIG. 2, the strip portion 2Re extends from the annular portion 2Rd toward an end of the substrate 1 in the longitudinal direction. The reverse surface portion 2Rf is provided on the reverse surface 1B of the substrate 1 to surround a corner. The reverse surface portion 2Rf is utilized for promoting formation of a solder fillet in mounting the light emitting device A on a circuit board. The mount portion 2Rg is formed to cover the wall surface of the groove 12R and utilized for mounting of the light emitting device A.

The electrodes 2B and 2G serve to supply power to the semiconductor light emitting elements 2B and 2G and include bonding pads 2Ba, 2Ga, semi-annular portions 2Bb, 2Gb, mount portions 2Bc, 2Gc and reverse surface portions 2Bd, 2Gd, respectively. The bonding pads 2Ba and 2Ga, on which the semiconductor light emitting elements 3B and 3G are bonded, respectively, are arranged to be spaced from each other in the longitudinal direction of the substrate 1 so as to face toward each other across the through-hole 11. In the illustrated example, the bonding pads 2Ba, 2Ga and the through-hole 11 are aligned in the longitudinal direction of the substrate 1. The bonding pads 2Ba and 2Ga are X-shaped. The semi-annular portions 2Bb, 2Gb are arranged to reach a long side of the substrate 1 and surround the openings of the grooves 12B and 12G, respectively, on the main surface 1A of the substrate 1. The semi-annular portions 2Bb, 2Gb are provided at locations deviated from the bonding pads 2Ba, 2Ga toward the two ends of the substrate 1 in the longitudinal direction. The mount portions 2Bc and 2Gc are formed to cover the grooves 12B and 12G, respectively, and utilized for mounting of the light emitting device A. The reverse surface portions 2Bd and 2Gd surround the openings of the grooves 12B and 12G on the reverse surface 1B of the substrate 1, respectively, and are utilized for promoting formation of a solder fillet in mounting the light emitting device A.

The electrode 2C is an anode common electrode electrically connected to the anode electrodes (not shown) of the semiconductor light emitting elements 3R, 3G, 3B. The electrode 2C includes two pads 2Ca for wire connection (the right pad 2Ca and the left pad 2Ca in FIG. 1), a strip portion 2Cb, an arcuate portion 2Cc, a mount portion 2Cd and a reverse surface portion 2Ce. Wires 4R and 4G are bonded to the right pad 2Ca, whereas a wire 2B is bonded to the left pad 2Ca. The two pads 2Ca are spaced from each other in the longitudinal direction of the substrate 1. In the illustrated example, the two pads 2Ca are provided on the main surface 1A of the substrate 1 at locations close to the upper flat surface 1D (the surface opposite to the mount surface 1C) of the substrate 1. In the longitudinal direction of the substrate 1, the left pad 2Ca is provided at a location deviated from the bonding pad 2Ba toward the left end of the substrate 1, whereas the right pad 2Ca is provided at a location deviated from the bonding pad 2Ga toward the right end of the substrate 1. That is, in the longitudinal direction of the substrate 1, the left pad 2Ca is positioned between the bonding pad 2Ba and the left end of the substrate 1, whereas the right pad 2Ca is positioned between the bonding pad 2Ga and the right end of the substrate 1. The strip portion 2Cb is formed along a long side and a short side of the main surface 1A of the substrate 1. Part of the strip portion 2Cb (the part extending between two pads 2Ca) connects the two pads 2Ca to each other. The arcuate portion 2Cc is formed to surround the opening of the groove 12C on the main surface 1A of the substrate 1. The mount portion 2Cd is formed to cover the groove 12C of the substrate 1 and utilized for mounting of the light emitting device A. The reverse surface portion 2Ce surrounds the opening of the groove 12C on the reverse surface 1B of the substrate 1 and is utilized for promoting formation of a solder fillet in mounting the light emitting device A.

The semiconductor light emitting elements 3R, 3G and 3B are fixed to the bonding pads 2Ra, 2Ga and 2Ba via e.g. conductive paste, respectively. As will be understood from FIG. 1, the three semiconductor light emitting elements 3R, 3G, 3B are at positions corresponding to the three vertices of a triangle. Specifically, the center of the semiconductor light emitting element 3R is at a position corresponding to the vertex of an isosceles triangle, whereas the center of each of the semiconductor light emitting elements 3B and 3G is at a position corresponding to an end of the base of the isosceles triangle. Further, the respective centers of the semiconductor light emitting elements 3B and 3G are positioned on a hypothetical straight line extending in the longitudinal direction of the substrate 1. The center of the semiconductor light emitting element 3R is closer to a longitudinal edge (upper edge in FIG. 1) of the main surface 1A of the substrate 1 than the centers of the semiconductor light emitting elements 3B and 3G are. The rectangular surface of the semiconductor light emitting element 3R illustrated in FIG. 1 is a square having sides of about 0.15 mm. The rectangular surface of each of the semiconductor light emitting elements 3G and 3B similarly illustrated in FIG. 1 is a square having sides of about 0.2 to 0.3 mm. In this way, the semiconductor light emitting element 3R, which is adapted to emit red light, is smaller in size than the other two semiconductor light emitting elements 3G and 3B.

The wires 4R, 4G, 4B are made of e.g. gold (Au) and electrically connect the anode electrodes (not shown) of the semiconductor light emitting elements 3R, 3G, 3B to the electrode 2C. As illustrated in FIG. 1, the left end of the wire 4R is connected to the semiconductor light emitting element 3R, whereas the right end of the wire 4R is connected to the right pad 2Ca. The connection point of the right end of the wire 4R is on the right side of the semiconductor light emitting element 3G in the longitudinal direction of the substrate 1. The left end of the wire 4G is connected to the semiconductor light emitting element 3R, whereas the right end of the wire 4G is connected to the right pad 2Ca. That is, both of the wires 4R and 4G are connected to the right pad 2Ca at their right ends. The left end of the wire 4B is connected to the left pad 2Ca, whereas the right end of the wire 4B is connected to the semiconductor light emitting element 3B.

The case 5 is a frame-shaped member made of e.g. a white resin and surrounds the semiconductor light emitting elements 3R, 3G, 3B, as will be understood from FIGS. 1-3. The protective resin 6 is made of a transparent resin which transmits light emitted from the semiconductor light emitting elements 3R, 3G, 3B and fills the space surrounded by the case 5. The protective resin 6 protects the semiconductor light emitting elements 3R, 3G, 3B.

As illustrated in FIGS. 2 and 3, the reverse surface 1B of the substrate 1 is formed with a resist film 7. The resist film 7 prevents unfavorable connection of the electrodes 2R, 2G, 2B, 2C via solder in the process of mounting the light emitting device A. The resist film 7 also serves to protect the strip portion 2Re. The opening of the through-hole 11 is closed by the resist film 7 on the reverse surface 1B. With this arrangement, liquid resin as the material of the protective resin 6 is prevented from leaking through the through-hole 11. As illustrated in FIG. 2, the resist film 7 has an asymmetric shape so that the mounting of the light emitting device A with wrong polarity is prevented.

The advantages of the light emitting device A are described below. In the above-described arrangement, of the electrode 2R, only the bonding pad 2Ra and the first annular portion 2Rb are provided on the main surface 1A of the substrate 1, and the other portions are provided on the inner wall of the through-hole 11 or the reverse surface 1B or the mount surface 1C of the substrate 1. In this arrangement, the electrode 2R does not include a portion extending from the semiconductor light emitting element 3R to the periphery of the substrate 1. This is suitable for mounting the three semiconductor light emitting elements 3R, 3G, 3B in the narrow region of the main surface 1A of the substrate 1. Further, by arranging the three semiconductor light emitting elements 3R, 3G, 3B in a triangular shape, it is possible to position the semiconductor light emitting elements 3G and 3B close to the semiconductor light emitting element 3R and also position the semiconductor light emitting elements 3G and 3B close to each other. Thus, the light emitted from the semiconductor light emitting elements 3R, 3G, 3B is properly combined together, whereby ideal white light is obtained.

As noted above, an end of the wire 4R bonded to the semiconductor light emitting element 3R is bonded to the right pad 2Ca at a position on the right side of the semiconductor light emitting element 3G in the longitudinal direction of the substrate 1. With this arrangement, it is not necessary to provide a space for bonding the wire 4R within the triangular region surrounded by the three semiconductor light emitting elements 3R, 3G, 3B, which holds true for the other two wires 4G and 4B. This is suitable for arranging the semiconductor light emitting elements 3R, 3G, 3B close to each other. Moreover, bonding the two wires 4R and 4G to the single pad 2Ca occupies less space than preparing an individual pad for each of the wires 4R and 4G.

The semiconductor light emitting element 3R, which is positioned at the center in the longitudinal direction of the substrate 1, is made smaller in size than the other two semiconductor light emitting element 3G and 3B, as noted above. This is suitable for arranging the semiconductor light emitting elements 3R, 3G, 3B close to each other. Further, clear white light is obtained by sandwiching the semiconductor light emitting element 3R for emitting red light between the semiconductor light emitting elements 3R and 36 for emitting green light and blue light.

The semiconductor light emitting element to be used in the present invention is not limited to the type designed to be bonded at the lower surface, with a wire bonded to the upper surface. For instance, use may be made of a semiconductor light emitting element of the type in which two wires are to be bonded to the upper surface. Alternatively, use may be made of a semiconductor light emitting element of the flip chip mounting type which does not use a wire.

The invention claimed is:

1. A side-view type semiconductor light emitting device comprising:

an elongated substrate including a main surface in a form of an elongated rectangle, a reverse surface opposite to the main surface, a mount surface extending between the main surface and the reverse surface, a flat surface opposite to the mount surface and extending between the main surface and the reverse surface, a first end surface and a second end surface spaced from each other in a longitudinal direction of the substrate, and a through-hole extending from the main surface to the reverse surface;

a first, a second and a third semiconductor light emitting elements mounted on the main surface of the substrate; and an electrode electrically connected to the first semiconductor light emitting element and extending to the reverse surface of the substrate via the through-hole;

wherein the first semiconductor light emitting element and the through-hole are positioned between the second semiconductor light emitting element and the third semiconductor light emitting element in the longitudinal direction of the substrate, the second semiconductor light emitting element is arranged closer to the first end surface of the substrate, and the third semiconductor light emitting element is arranged closer to the second end surface of the substrate, wherein the mount surface of the substrate is provided with a plurality of surface-mount electrodes each extending from the main surface to the reverse surface, wherein the main surface of the substrate is provided with a common electrode connected to the first, the second and the third semiconductor light emitting elements, respectively, via wires, the common electrode including two pads spaced apart from each other in the longitudinal direction of the substrate, wherein the first semiconductor light emitting element is disposed between the two pads in the longitudinal direction of the substrate, and wherein the flat surface extends from the first end surface to the second end surface of the substrate.

2. The semiconductor light emitting device according to claim 1, further comprising a wire, wherein the wire includes a first end bonded to the first semiconductor light emitting element and a second end bonded to one of the two pads, and said one of two pads is arranged at a position deviated from the second semiconductor light emitting element toward the first end surface of the substrate in the longitudinal direction of the substrate.

3. The semiconductor light emitting device according to claim 2, further comprising an additional wire for connecting the second semiconductor light emitting element and said one of the two pads to each other.

4. The semiconductor light emitting device according to claim 3, wherein the main surface of the substrate is provided with a strip-like electric conductor extending in the longitudinal direction, and the strip-like electric conductor connects said one of the two pads to one of the surface-mount electrodes.

5. The semiconductor light emitting device according to claim 4, wherein said one of the two pads is greater in width than the strip-like electric conductor.

6. The semiconductor light emitting device according to claim 1, wherein the main surface of the substrate includes a side edge extending in the longitudinal direction of the substrate, and the first semiconductor light emitting element is positioned closer to the side edge than the second and the third semiconductor light emitting elements are.

7. The semiconductor light emitting device according to claim 1, wherein the first semiconductor light emitting element is smaller in size than the second and the third semiconductor light emitting elements.

8. The semiconductor light emitting device according to claim 1, wherein the first semiconductor light emitting element is adapted to emit red light, one of the second and the third semiconductor light emitting elements is adapted to emit blue light and the other one of the second and the third semiconductor light emitting elements is adapted to emit green light.

9. The semiconductor light emitting device according to claim 1, wherein the surface mount electrodes are provided in grooves, respectively, each of the grooves being formed in the mount surface and extending from the main surface to the reverse surface.

10. The semiconductor light emitting device according to claim 9, wherein at least one of the second semiconductor light emitting element and the third semiconductor light emitting element overlaps the grooves as viewed in the longitudinal direction of the substrate.

11. The semiconductor light emitting device according to claim 1, wherein the first semiconductor light emitting element is spaced apart from the through-hole.

12. The semiconductor light emitting device according to claim 1, further comprising semi-annular conductors each connected to one of the surface-mount electrodes, wherein each of the second and the third semiconductor light emitting elements is at least partially held in contact with one of the semi-annular conductors.

13. The semiconductor light emitting device according to claim 1, wherein the plurality of surface-mount electrodes include a first surface-mount electrode and a second surface-mount electrode, and wherein the electrode electrically connected to the first semiconductor light emitting element is connected to the first surface-mount electrode, and the common electrode is connected to the second surface-mount electrode.

14. The semiconductor light emitting device according to claim 1, wherein the length of the mount surface is longer than the width of the first end surface and the second end surface of the substrate.

15. The semiconductor light emitting device according to claim 1, wherein the width of each of the first end surface and the second end surface is substantially equal to a distance between the mount surface and the flat surface of the substrate.

16. The semiconductor light emitting device according to claim 1, wherein the through-hole overlaps both the second semiconductor light emitting element and the third semiconductor light emitting element as viewed in the longitudinal direction of the substrate.

* * * * *